United States Patent
Worm

[19]
[11] Patent Number: 5,952,648
[45] Date of Patent: Sep. 14, 1999

[54] LINEAR OPERATING MECHANISM FOR AN OPTICAL SWITCH

[75] Inventor: Steven Lee Worm, Raleigh, N.C.

[73] Assignee: Square D Company, Palatine, Ill.

[21] Appl. No.: 08/748,699

[22] Filed: Nov. 13, 1996

[51] Int. Cl.⁶ ..................................... G01D 5/34
[52] U.S. Cl. ........................ 250/229; 250/222.1
[58] Field of Search ................ 250/229, 237 R, 250/227.21, 222.1; 356/373, 375; 341/13

[56] References Cited

U.S. PATENT DOCUMENTS 4,429,219  1/1984  Yochum et al. ..................... 250/229

*Primary Examiner*—Edward P. Westin
*Assistant Examiner*—Kevin Pyo
*Attorney, Agent, or Firm*—David R. Stacey; Larry T. Shrout; Larry I. Golden

[57] ABSTRACT

A linear operating mechanism for a slotted optical switch 10 which produces a guaranteed OFF-point for a consistent linear displacement of a switch operator 58 with respect to a reference surface 66 of the device enclosure 62. The guaranteed OFF-point is consistently repeatable from one device to another. The device enclosure 62 defines an integrally formed support for receiving an emitter 14 and a receiver 18 of the slotted optical switch 10. The enclosure 62 further defines a fixed Off-plane 114 immediately adjacent the receiver 18 and precisely located with respect to a reference surface 66 on an outside surface of the enclosure 62. The switch operator 58 is received within the optical switch slot and has a distal end 86 extending outside the enclosure 62 a precise distance with respect to the reference surface 66 when the operator is in a normally biased first position. A window 74 defined by the operator at a predetermined position with respect to its distal end 84 determines the normal state of the optical switch 10 and changes that state as the operator 58 is linearly moved to a second position in response to an external force applied to its distal end 86. One edge 78/82 of the window 74 further defines a movable OFF-plane 78/82 located at a precise distance from the distal end 86. The guaranteed OFF-point is obtained when a predetermined linear displacement of the operator 58 with respect to the reference surface 66 permits the movable OFF-plane 78/82 to coincide with the fixed OFF-plane 114 thereby prohibiting light from reaching the receiver 18.

15 Claims, 6 Drawing Sheets

LINEAR OPERATING MECHANISM FOR AN OPTICAL SWITCH

FIELD OF THE INVENTION

The present invention relates to the field of photoelectric switches and particularly to a lineage operating mechanism for an optical switch.

BACKGROUND OF THE INVENTION

Optical switches are well known in the electronics industry. These devices employ an optical emitter which provides a light source and an optical receiver or sensor which produces an electrical output in response to receiving the emitted light. The emitter is usually a LED (light emitting diode) and the receiver is usually a photodiode electrically connected to the base of a transistor, thus forming a light sensitive transistor which operates as an optical switch. Optical switches consisting of matched optical pairs (one emitter and one receiver) enclosed within a molded case are commercially available from a number of electronic component manufacturers such as Sharp Electronics Corporation and Optek Technology Inc. These optical switches are constructed such that a generally semispherical lens of the emitter is directly opposite a generally semispherical lens of the receiver thereby permitting light emitted from the emitter to be easily received by the receiver. The emitter emits a quantity of light energy relative in strength to an electric current passing through the emitter. The photodiode of the receiver transforms light energy into an electrical output which is proportional to the amount of light energy received. This electrical output is applied to the base of the associated transistor. When the electrical output is equal to or greater than the base threshold level of the transistor, it begins to conduct. This causes a detection circuit connected to the transistor to indicate an ON state to any device being controlled by the optical switch. The two lenses are spaced apart such that an operator made from an opaque material can be slidably positioned between them thereby preventing light from the emitter from being received by the receiver. When the light received by the receiver is not sufficient to produce an electrical output equal to or greater than the base threshold level of the transistor it will not conduct, and the detection circuit will indicate an OFF state to any device controlled by the optical switch. The receiver is switched between these two states by selectively moving the operator such that it is either between or not between the two lenses of the optical pair. In many applications, the precise linear displacement of the operator required to produce a guaranteed OFF-point (point at which no light from the emitter is received by the receiver) is required. This linear displacement is generally measured with respect to a reference surface on the device enclosure. Since ambient light received by the receiver can affect the OFF-point, and since the lenses of the emitter and receiver are semispherical in shape, thereby emitting and receiving light from all directions, the linear displacement of the operator at the guaranteed OFF-point can vary greatly from one device to another. This is true even for devices of the same design and manufacturer's catalog number.

When precise linear displacement of the operator at the guaranteed OFF-point with respect to the reference surface is critical, it has been common practice to use more expensive apertured optical switches. The apertures are very narrow slits placed directly in front of the lenses of one or both of the emitter and receiver, thereby limiting the direction and amount of light that can be received. The aperture placed in front of the emitter lens is generally wider than the aperture placed in front of the receiver lens. Matched optical pairs are either overmolded with an opaque material leaving only the narrow apertures in front the lenses or are placed in an auxiliary housing having apertures integrally formed in the housing walls. Apertured optical switches do have a more precisely controllable OFF point and a more stable OFF state than unapertured optical switches. However, the apertures cause other problems which can effectively defeat their intended purpose. The overmolded apertures or auxiliary apertured housings add additional mechanical tolerances to the linear operating mechanism of the optical switch. These additional mechanical tolerances reduce the chance that the linear displacement of the operator at the guaranteed OFF point, with respect to the reference surface, will be consistent between individual optical switches. Apertures also reduce the amount of light which can be received by the receiver during the full ON state which in turn reduces the base current of the receiver transistor. Since the gain of the receiver transistor is proportional to the amount of light received, an apertured optical switch will have lower gain than an unapertured optical switch, resulting in a narrower range or difference between the guaranteed minimum ON and minimum OFF signals from the receiver. In both apertured and unapertured optical switches, the dark current (leakage current in the transistor when no light is detected) can vary significantly from one optical switch to another of the same design and manufacturer's catalog number. The dark current causes a DC offset in the output of the optical switch. The DC offset, in combination with the narrower range between guaranteed minimum ON and OFF signals caused by lower gain of an apertured optical switch, can cause a fixed threshold DC detection circuit to fail to detect an ON or OFF state of the optical switch. In a worst case scenario, the dark current of one optical switch can be greater that the guaranteed minimum ON state of another optical switch. In this situation the ON state would not reach the threshold of the DC detection circuit and therefore the DC detection circuit would not indicate a change in state of the optical switch. One solution to this problem is to use an AC detection method which is not affected by the variances of the DC offset. The AC detection method is more expensive than a DC detection method and again increases the cost of producing an optical switches with a precisely repeatable guaranteed OFF point and stable OFF state. A more desirable solution would be to provide the less expensive higher gained unapertured optical switch with a means for obtaining a guaranteed OFF-point at a precise linear displacement of the operator which can be consistently repeatable from one device to a another within a family of devices or a common manufacturer's catalog number. It would also be desirable to provide a means that would ensure sufficient gain in the receiver transistor such that a wider range or difference between the guaranteed ON and OFF signals is produced, thus allowing the less expensive DC detection method to be used.

SUMMARY OF THE INVENTION

The present invention provides a simple means for consistently obtaining a guaranteed OFF-point at a precise linear displacement of the operator for unapertured optical switches, maintaining a stable OFF state and ensuring sufficient gain in the receiver transistor to use the less expensive DC detection method.

A portion of a molded enclosure which houses the optical switch and a printed circuit board defines a first integrally formed channel for slidably receiving an optical switch emitter and a second integrally formed channel for slidably receiving an optical switch receiver. The channels are generally C-shaped in cross-section and arranged in parallel such that the open sides of each channel face each other and are spaced apart. The emitter and receiver are positioned in the channels such that their lenses are in opposed relationship. The open side of the second channel further defines a first longitudinal edge and second longitudinal edge. A half-aperture is also integrally formed from the enclosure and extends outward from one of the first or second longitudinal edges in a direction generally toward the other of the first or second longitudinal edges. The half-aperture ends at a predetermined distance from its origin such that a fixed-OFF plane is formed. The fixed-OFF plane is generally parallel to and intermediate the first and second longitudinal edges. Since the fixed-OFF plane is an integral part of the molded enclosure its position with respect to a reference surface on the enclosure is consistently accurate from one enclosure to another.

A molded operator made of opaque material is slidably positioned between the lens of the emitter and the lens of its associated receiver. The operator is normally biased to a first position and is movable to a second position. In one of the first or second positions a window defined by the operator is positioned intermediate the lens of the emitter and the lens of its associated receiver thus permitting light from the emitter to be received by the receiver producing an ON state. A particular one of the defining edges of the window forms a movable OFF-plane generally parallel to the fixed OFF-plane of the receiver channel. Since the operator is a molded part, the precise location of the movable OFF-plane with respect to a distal end of the operator is consistently accurate from one operator to another. The distal end of the operator extends outside the enclosure and is maintained at a predetermined distance from the reference surface of the optical switch enclosure when in its normally biased position. This permits a precise determination of the guaranteed OFF-point with respect to the linear displacement or travel distance of the operator for all optical switches of the same design or manufacturer's catalog number. In the other of the first or second positions, the opaque body of the operator is positioned intermediate the lens of the emitter and the lens of its associated receiver, thus prohibiting light from the emitter from being received by the receiver and thereby producing an OFF state. A precise OFF point for the optical switch is defined when the movable OFF-plane of the operator window is coincident with the fixed OFF-plane of the half-aperture. The greater gain of the unapertured optical switch permits the fixed threshold of a DC detecting circuit to be set at a sufficiently high level that any DC offset due to ambient light or dark current will not adversely effect the ability to detect an OFF state of the optical switch.

Other features and advantages of the invention will become apparent to those skilled in the art upon review of the following detailed description, claims and drawings.

Figure 1:
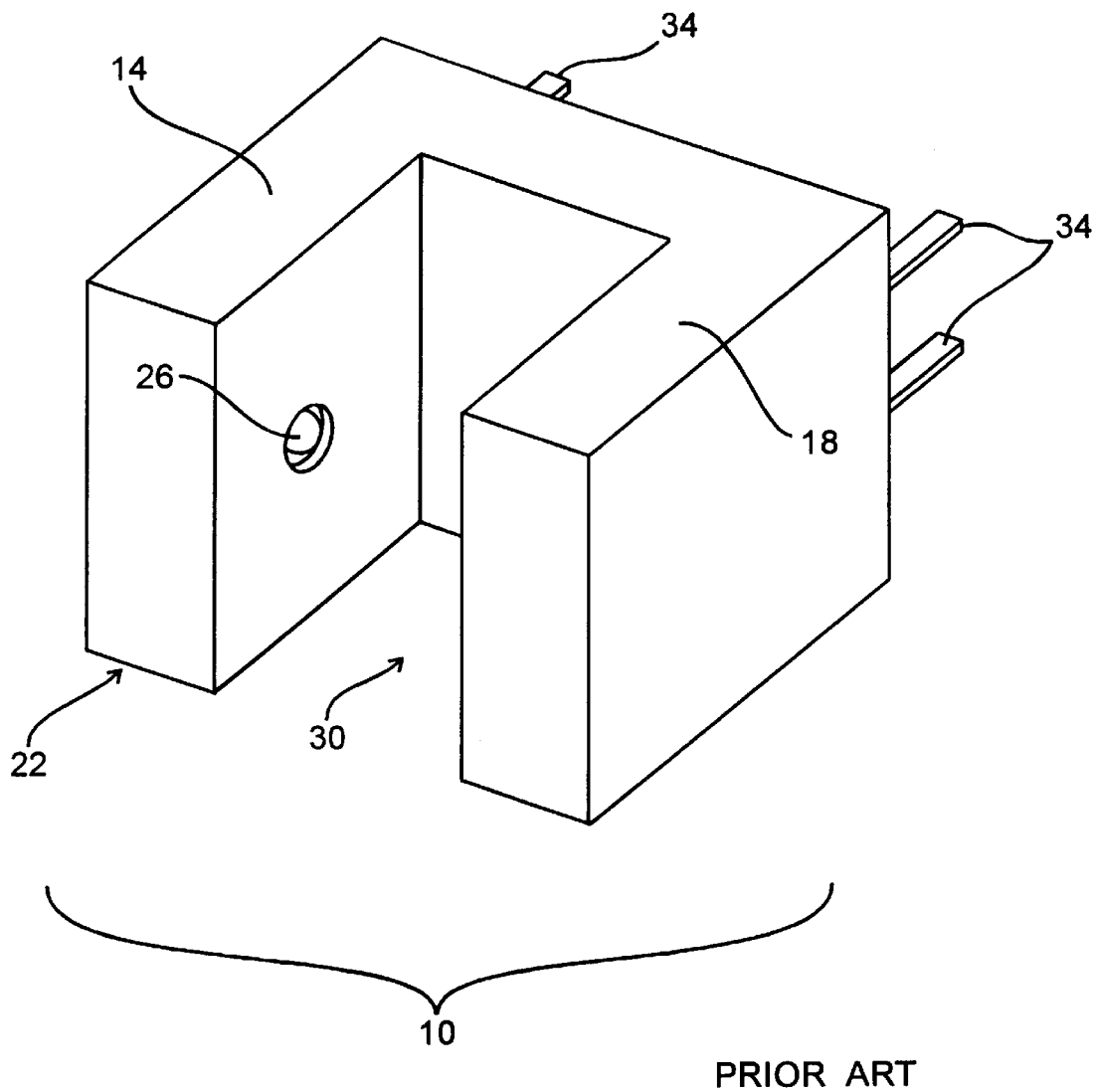
FIG. 1 is an isometric view of a commercially available optical switch.

Before one embodiment of the invention is explained in detail, it is to be understood that the invention is not limited in its application to the details of construction and description or illustrated in the drawings. The invention is capable of other embodiments and of being practiced or being carried out in various other ways. Also, it is to be understood that the phraseology and terminology used herein is for the purpose of description and should not be regarded as limiting.

DESCRIPTION OF THE PREFERRED EMBODIMENT

FIG. 1 illustrates a commercially available unapertured optical switch generally indicated by reference numeral 10. For the purpose of this description, it will be assumed that the unapertured optical switch 10 is similar to the OPTEK slotted optical switch, catalog number OPB620. The optical switch 10 includes an emitter 14 and a receiver 18 enclosed within a molded housing 22. Each of the emitter 14 and the receiver 18 includes a semispherical lens 26. The lenses 26 are positioned directly opposite one another and spaced apart by a slot 30 formed in the housing 22. Located directly behind the lens 26 of the emitter 14 is an LED which can be any one of a number of types. The LED emits a quantity of light proportional to an amount of electrical current passing through it. Located directly behind the lens 26 of the receiver 18 is a photosensitive device such as a photodiode which produces an electric signal in response to light incident on the photosensitive device. The strength of the electric signal is proportional to the amount of incident light. Both the emitter 14 and receiver 18 have electrical terminals 34 for making electrical connections to a printed circuit board and to a power supply and a detection circuit which reside on the printed circuit board. The power supply provides power for the optical switch and the detection circuit responds to the output of the receiver 18.

Figure 2:
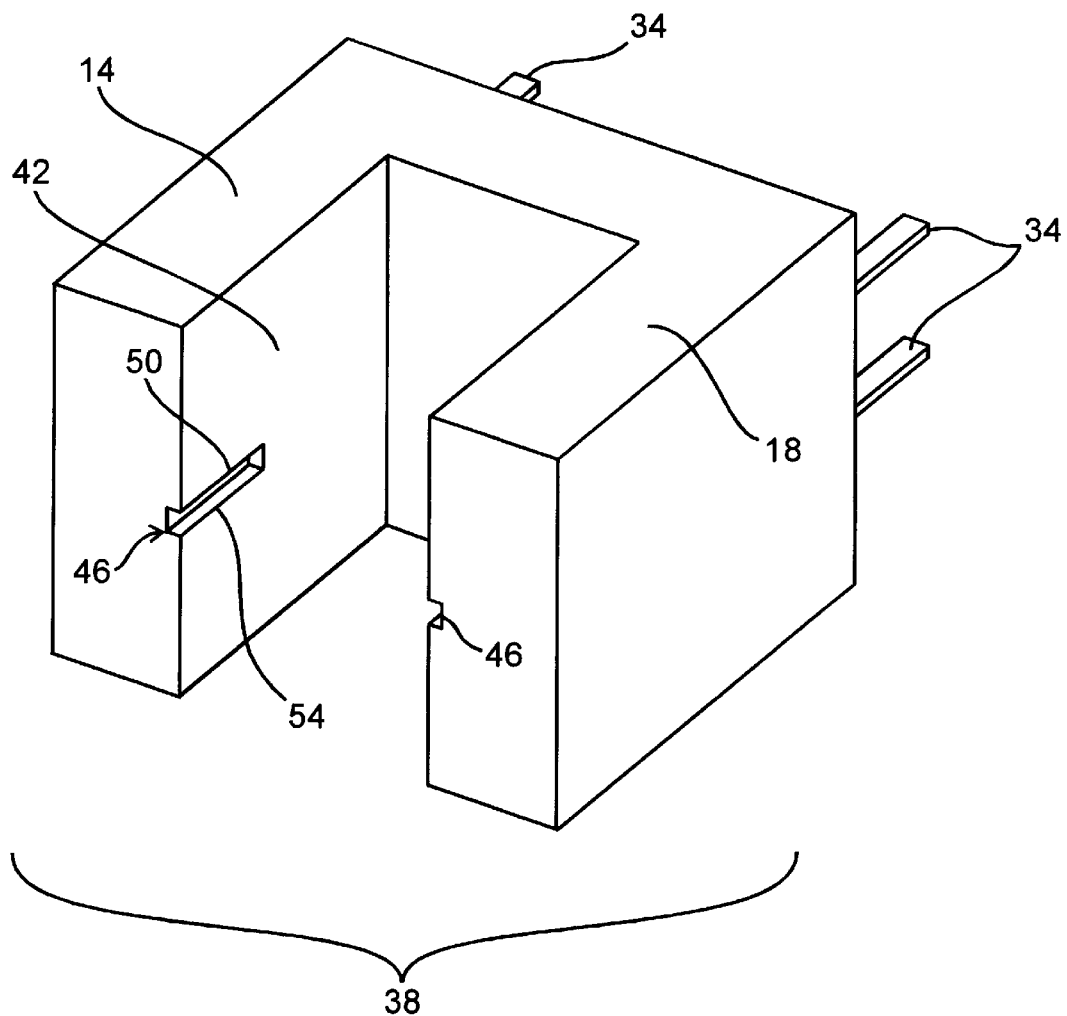
FIG. 2 is a isometric view of a commercially available apertured optical switch.
Figure 3A:
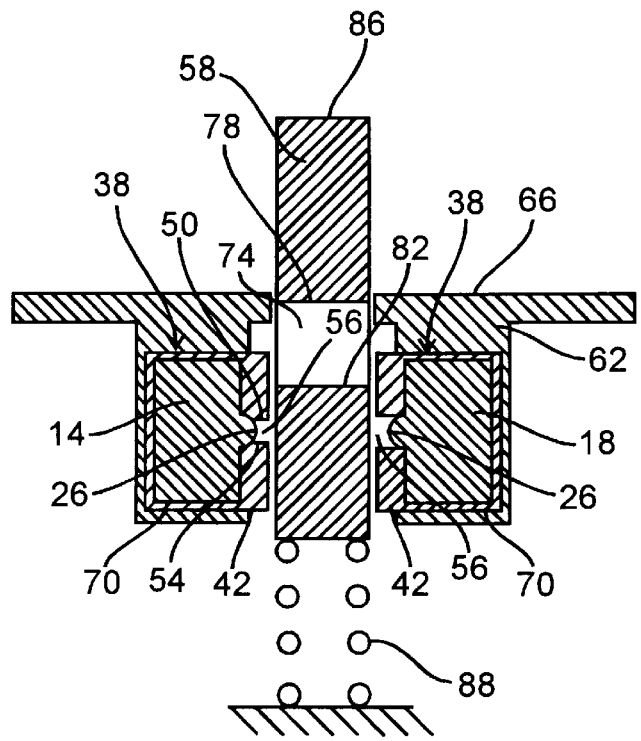
FIG. 3a is a cross-sectional view of a commercially available apertured optical switch installed in an enclosure, similar to that of the present invention, with an operator at its first or normally biased position—in this figure, a normally dark condition.

FIG. 2 illustrates a commercially available apertured optical switch generally indicated by reference numeral 38. For the purpose of this discussion it will be assumed that the apertured optical switch 38 is similar to the OPTEK slotted optical switch, catalog number OPB660N. The apertured optical switch 38 is made by overmolding an unapertured optical switch, such as the one shown in FIG. 1, with an opaque material 42 leaving only a narrow slit 46 defined by a first edge 50 and a second generally parallel edge 54 at each of the lenses 26. The apertured optical switch 38 can also be made as a monolithic device. As seen in FIG. 3a, each slit 46 defines a small aperture 56 directly in front of one of the lenses 26 such that the amount of light emitted by the emitter 14 or received by the receiver 18 is restricted by the associated aperture 56. By restricting the amount of light which can be received by the receiver 18 its gain is reduced, thereby reducing the output signal of the apertured optical switch 38. One of the two parallel edges, 50 or 54, of the slit 46 in front of the receiver 18 provides a fixed-OFF plane for the apertured optical switch 38. The fixed-OFF plane provides a more precise OFF-point than the unapertured optical switch 10 shown in FIG. 1.

Figure 3B:
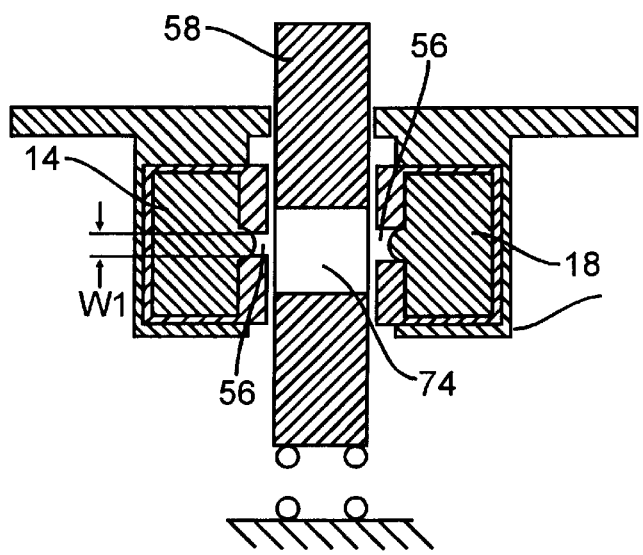
FIG. 3b is a cross-sectional view of the apertured optical switch of FIG. 3a with the operator at it second position.
Figure 3C:
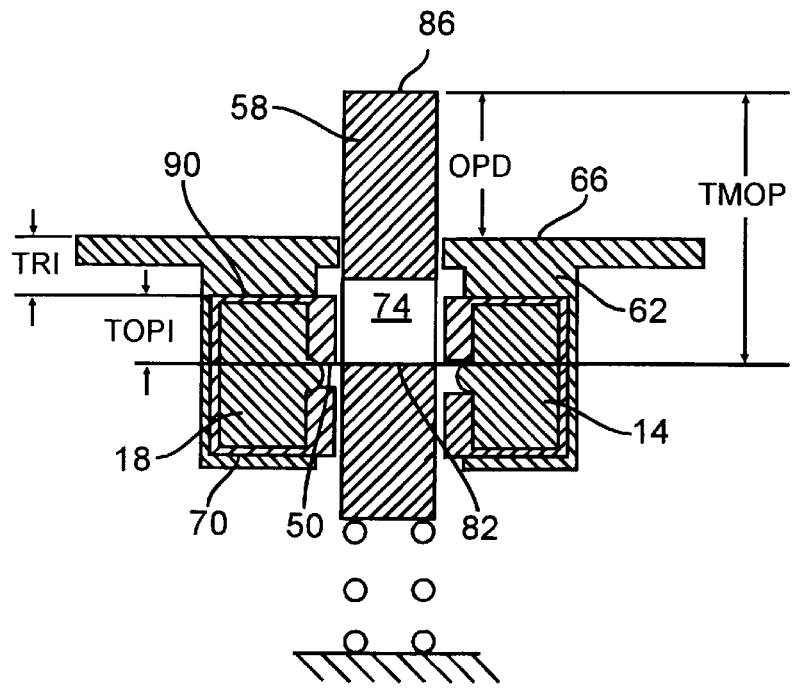
FIG. 3c is a cross-sectional view of the apertured optical switch of FIG. 3a with the operator at the guaranteed OFF-point.

FIGS. 3a, 3b and 3c illustrate in cross-section the relationship of an apertured optical switch 38, such as the one shown in FIG. 2, to an operator 58 and a molded enclosure 62 in which they are installed. In order for the optical switch 38 to function properly in this type of application, it must be fixedly positioned by appropriate means with respect to a reference surface 66 located on the enclosure 62. For the purpose of providing the best possible comparison between the state of the art and the present invention, the apertured optical switch 38 is shown positioned in the enclosure 62 in a manner similar to that used in locating an unapertured optical switch 10, such as that shown in FIG. 1, in a similar enclosure in accordance with the present invention, as further described hereinbelow. In this positioning method, a portion of the enclosure 62 defines two generally parallel channels 70, each having a generally C-shaped cross-section and arranged such that the open sides of each channel 70 face each other. The emitter 14 is slidably receive in one channel and the receiver 18 is slidably received in the other such that their lenses 26 are in opposed relationship. The operator 58 is molded from an opaque material and is generally rectangular in shape. A window 74 is defined at a predetermined position along its length. A first edge 78 and a second edge 82 of the window 74 are generally parallel to one another and perpendicular to a longitudinal axis of the operator 58. The first and second edges, 78 and 82, respectively, are each located at a particular distance from a distal end 86 of the operator 58. One of the first or second edges, 78 or 82, respectively, will define a movable-OFF plane, depending on the normal state of the optical switch 38. The position of the window 74 in the operator 58 determines the normal state of the optical switch 38. The operator 58 is normally biased to a first position by a spring 88, as shown in FIG. 3a, and linearly movable to a second position as shown in FIG. 3b. The distal end 86 of the operator 58 extends outside the enclosure 62 such that it may be engaged for linear movement of the operator 58 between its first and second positions. In one of the operator's first or second positions, the window 74 will be intermediate the lenses 26 and in the other of the first or second positions the (unwindowed portion of the) opaque operator 58 will be intermediate the lenses 26, thus determining the output state of the optical switch 38. As shown in FIG. 3c, the guaranteed OFF-point is located at some point between the first and second positions where the fixed-OFF plane defined by one of the edges 50 or 54 of the receiver aperture 56 coincides with a movable-OFF plane defined by one of the first or second edges, 78 or 82, respectively, of the window 74. The displacement of the operator 58 with respect to the reference surface 66 at the guaranteed OFF-point is shown as OPD (OFF-point displacement). It can be seen that a first mechanical tolerance (TMOP) exists between the distal end 86 of the operator 58 and the movable OFF-plane—in this application, defined by second or lower edge 82 of the window 74. A second mechanical tolerance (TRI) exists between the reference surface 66 and the interface 90 between the optical switch receiver 18 and the channel 70. A third mechanical tolerance (TOPI) exists between the fixed-OFF plane defined by the first or upper edge so of the aperture 56 and an interface 90. The total mechanical tolerance (MTT) of the guaranteed OFF-point is therefore MTT=±(TMOP+TRI+TOPI). TRI is a mechanical tolerance between two separate parts and can be significant from one device to another. TMOP and TOPI are tolerances related to the mold from which the parts came and should be consistent from one device to another. However, since the MTT is a sum of the three tolerances it can vary significantly from one device to another. Therefore the linear displacement of the operator 58 at the guaranteed OFF-point can vary significantly from one device to another. Since an apertured optical switch 38 is used, the light received by the receiver 18 is limited to that which can pass through the narrow slit of the aperture 56 as indicated by W1 in FIG. 3b.

Figure 4:
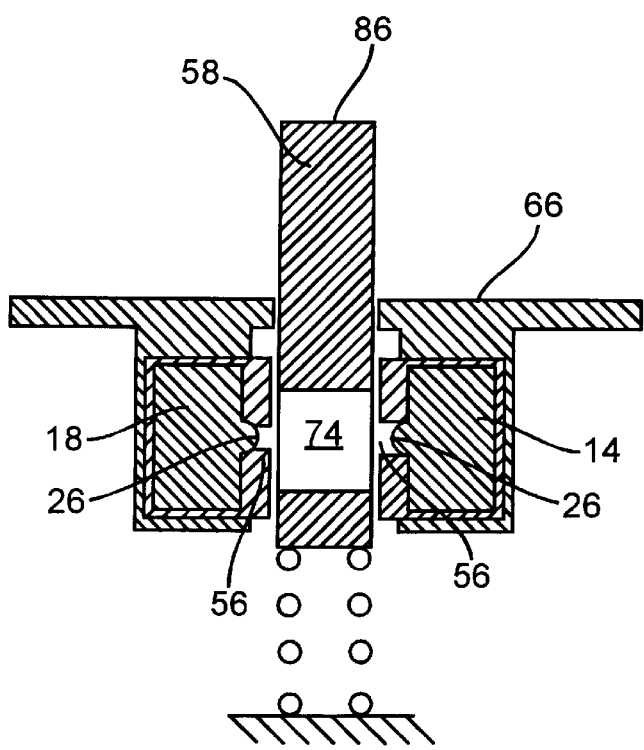
FIG. 4 is a cross-sectional view of a commercially available apertured optical switch installed in an enclosure, similar to that of the present invention, with an operator at its first or normally biased position—in this figure, a normally light condition.

FIG. 4 illustrates the same general structure as described for FIG. 3a, except that the window 74 is positioned intermediate the lenses 26 when the operator 58 is in its normally biased position. In this configuration, the fixed-OFF plane becomes second or lower edge 54 of the aperture 56 in front of the receiver 18 and the movable-OFF plane becomes first or upper edge 78 of the window 74 in the operator 58.

Figure 5A:
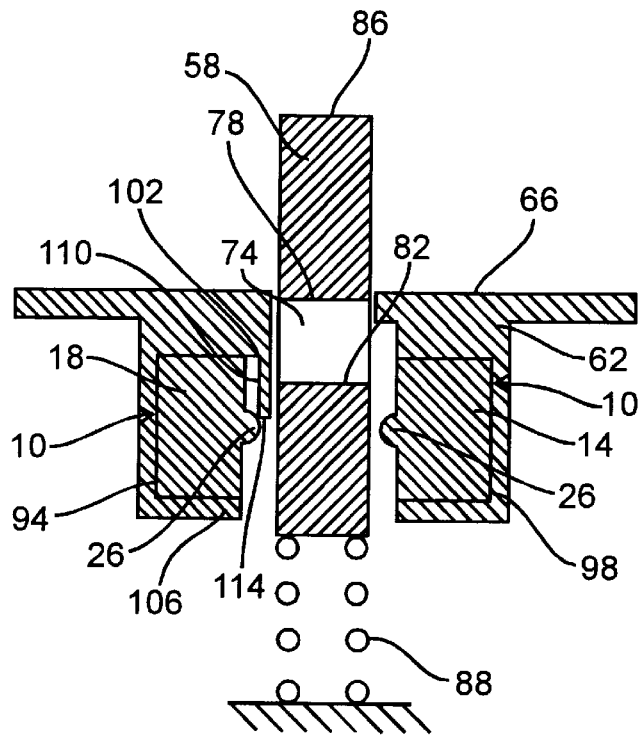
FIG. 5a is a cross-sectional view of an unapertured optical switch installed in an enclosure, in accordance with the present invention, with an operator positioned at its first or normally biased position—in this figure, a normally dark condition.
Figure 5B:
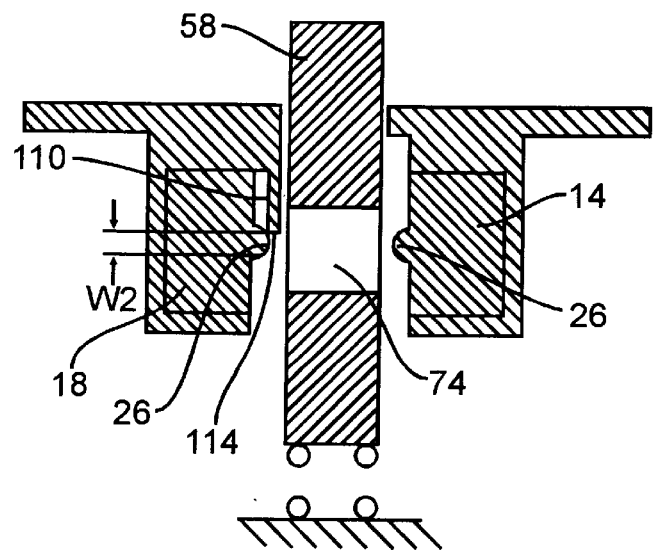
FIG. 5b is a cross-sectional view of the unapertured optical switch of FIG. 5a with the operator at it second position, in accordance with the present invention.
Figure 5C:
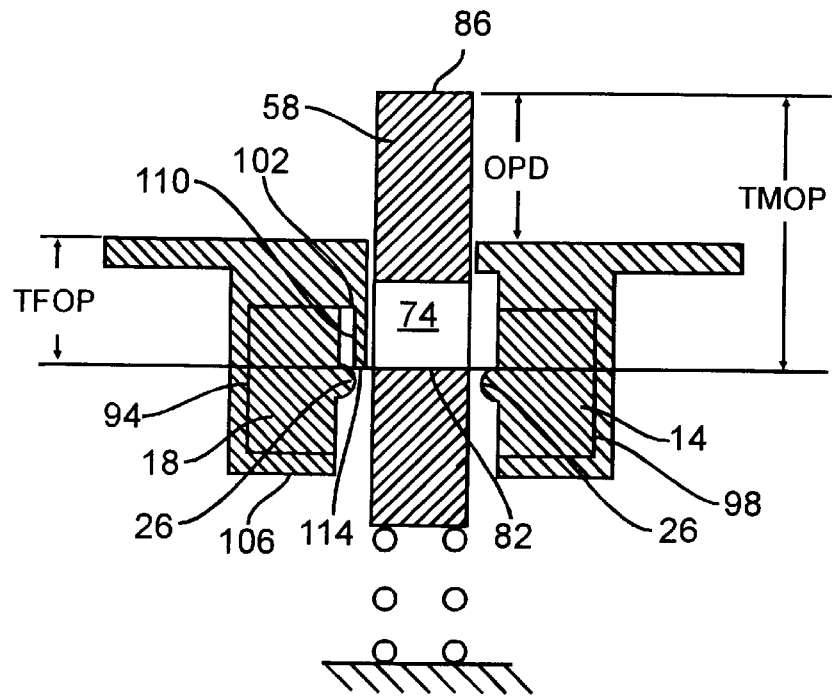
FIG. 5c is a cross-sectional view of the unapertured optical switch of FIG. 5a with the operator at the guaranteed OFF-point, in accordance with the present invention.

FIGS. 5a, 5b and 5c illustrate in cross-section the relationship of an unapertured optical switch 10, such as that shown in FIG. 1, to an operator 58 and an enclosure 62, in accordance with the present invention. The unapertured optical switch 10 and operator 58 are as previously described. The enclosure 62 is generally as described above with the following described differences. A first channel 94 and a second channel 98 are integrally formed from the enclosure 62 and are generally parallel to one another. The channels 94 and 98 have a generally C-shaped cross-section and are arranged such that the open sides face each other. The first channel 94 slidably receives the emitter 14 and the second channel 98 slidably receives the receiver 18 such that their lenses 26 are in an opposed relationship. The open side of the second channel 98 further defines a first longitudinal edge 102 and second longitudinal edge 106. A half-aperture 110, also integrally formed from the enclosure 62, extends outward from one of the first or second longitudinal edges, 102 and 106, respectively, in a direction generally toward the other of the first or second longitudinal edges, 102 and 106, respectively. The half-aperture 110 ends at a predetermined distance from its origin such that a fixed-OFF plane 114, generally parallel to and intermediate the first and second longitudinal edges, 102 and 106, respectively, is formed. Since the fixed-OFF plane 114 is integrally formed from the enclosure 62 its location with respect to the reference surface is consistent from one enclosure 62 to another. The position of the window 74 in the operator 58 determines the normal state of the optical switch 10 and will therefore determine from which of the first or second longitudinal edges, 102 or 106 respectively, the half-aperture 110 will extend. In the configuration of FIGS. 5a, 5b and 5c the half-aperture 110 extends downward from the first longitudinal edge 102. The mechanical operation of the linear mechanism is generally as described above. FIG. 5b illustrates the liner mechanism with the operator 58 in its second position with the window 74 intermediate the lenses 26. In this position there are no apertures 56 to restrict the light emitted from the emitter 18 and only a small segment of the receiver lens 26 is restricted by the half-aperture 110, thus more light can be received by the receiver 14. As shown in FIG. 5c, the guaranteed OFF-point is located at some point between the first and second positions of the operator 58 where the fixed-OFF plane 114 coincides with the movable-OFF plane defined by one of the first or second edges, 78 or 82 respectively, of the window 74. It can be seen that only two mechanical tolerances affect the repeatability of the guaranteed OFF-point from one device to another of the same device family or manufacturer's catalog number. The first mechanical tolerance (TMOP) is the dimension between the distal end 86 of the operator 58 and the movable OFF-plane, in this case defined by the second or lower edge 82 of the window 74. The second mechanical tolerance (TFOP) is the dimension between the fixed-OFF plane 114 and the reference surface 66. The total mechanical tolerance (MTT) for the guaranteed OFF-point is therefore MTT=± (TMOP+TFOP). Since both of these mechanical tolerances are related to dimensions of the mold from which the parts are made the linear displacement of the operator 58 at the guaranteed OFF-point should be consistent from one device to another. Also, the light which can be received by the receiver 18 when the window 74 is intermediate the lenses 26 is limited only by the half-aperture 110 and is illustrated by W2 as shown in FIG. 5b. Since more light is available to the receiver 18 during the ON state a higher gain is realized. The higher gain produces a larger range or difference between the guaranteed minimum ON and OFF signals from the receiver 18. This permits the fixed threshold of a DC detection circuit to be set at a level sufficiently high enough to overcome any DC offsets in the output of the receiver 18 caused by dark current and ambient light.

Figure 6:
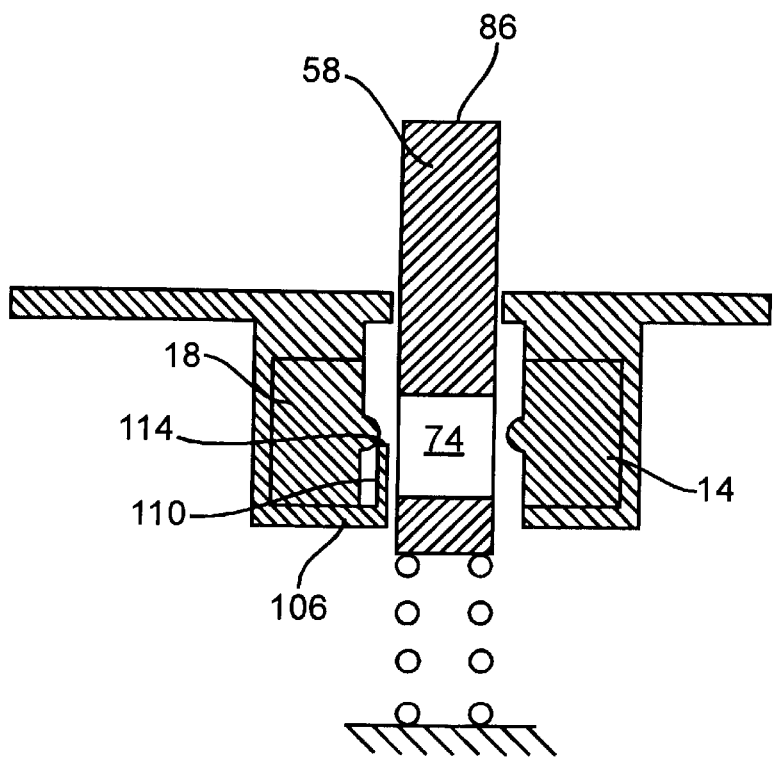
FIG. 6 is a cross-sectional view of a commercially available unapertured optical switch installed in an enclosure, in accordance with the present invention, with an operator at its first or normally biased position—in this figure, a normally light condition.

FIG. 6 illustrates the same general structure as described for FIG. 5a, except that the window 74 is positioned intermediate the lenses 26 when the operator 58 is in its normally biased position. In this configuration the half-aperture 110 extends upward from the second longitudinal edge 106 and the movable-OFF plane becomes first or upper edge 78 of the window 74 in the operator 58.

I claim:

1. A linear operating mechanism producing a guaranteed OFF-point consistently controllable from one optical switch device to another, said operating mechanism comprising:

an enclosure defining an optical switch support means for receiving an emitter and a receiver of an optical switch, a reference surface and a fixed OFF-plane, said fixed OFF-plane being precisely positioned with respect to said reference surface; and an operator, slidably positioned between the emitter and the receiver of the optical switch and having a distal end precisely positionable with respect to said reference surface, said operator further defining a movable OFF-plane precisely located with respect to said distal end, said operator being normally biased to a first position and linearly displaceable to a second position such that at some predetermined linearly displacement of said distal end with respect to said reference surface said movable OFF-plane and said fixed OFF-plane will coincide, thereby producing the guaranteed OFF-point.

2. The operating mechanism of claim 1 wherein said optical switch support means includes a first channel for slidably receiving the optical switch emitter and a second channel for slidably receiving the optical switch receiver, each said channel being integrally formed from said enclosure and having a generally C-shaped cross-section, said channels being generally parallel and spaced apart one from the other such that an open side of said first channel faces an open side of said second channel thereby permitting a lens of the emitter to be in a juxtaposed relationship with a lens of the receiver.

3. The operating mechanism of claim 2 wherein said second channel further defines first and second edges extending longitudinally along said open side and being generally parallel to said reference surface, one of said first or second edges further defining a half aperture which extends outward toward the other of said first or second edges terminating in said fixed OFF-plane, said fixed OFF-plane being generally parallel to and intermediate said first and second edges such that a small portion of the receiver lens is covered by said fixed OFF-plane.

4. The operating mechanism of claim 3 wherein said operator is generally rectangular in shape and defines a generally square window at a predetermined location along its length with respect to said distal end, said window having two edges generally parallel to said reference surface, one of said edges being said movable OFF-plane.

5. A linear operating mechanism for an optical switch producing a guaranteed OFF-point consistently controllable from one optical switch device to another of the same design, said operating mechanism comprising:

an enclosure defining an optical switch support means for receiving an emitter and a receiver of an optical switch, a reference surface and a fixed OFF-plane, said fixed OFF-plane being precisely positioned with respect to said reference surface and generally parallel to said reference surface; and an operator, slidably positioned between the emitter and the receiver of the optical switch and having a distal end precisely positionable with respect to said reference surface, said operator further defining a movable OFF-plane precisely positioned with respect to said distal end and generally parallel to said reference surface, said operator being normally biased to a first position and linearly displaceable to a second position such that at some predetermined linearly displacement of said distal end with respect to said reference surface said movable OFF-plane and said fixed OFF-plane will coincide, thereby producing the guaranteed OFF-point.

6. The operating mechanism of claim 5 wherein said optical switch support means includes a first channel for slidably receiving the optical switch emitter and a second channel for slidably receiving the optical switch receiver, each said channel integrally formed from said enclosure and having a generally C-shaped cross-section, said channels being generally parallel and spaced apart one from the other such that an open side of said first channel faces an open side of said second channel thereby permitting a lens of the emitter to be in juxtaposed relationship with a lens of the receiver.

7. The operating mechanism of claim 6 wherein said second channel further defines first and second edges extending longitudinally along said open side and being generally parallel to said reference surface, one of said first or second edges further defining a half aperture which extends outward toward the other of said first or second edges terminating in said fixed OFF-plane, said fixed OFF-plane being generally parallel to and intermediate said first and second edges such that a small portion of the receiver lens is covered by said fixed OFF-plane.

8. The operating mechanism of claim 7 wherein said operator is generally rectangular in shape and defines a generally square window at a predetermined location along its length with respect to said distal end, said window having two edges generally parallel to said reference surface, one of said edges being said movable OFF-plane.

9. A linear operating mechanism for an optical switch having a light emitter and a light receiver spaced apart one from the other and housed within an enclosure, said mechanism comprising:

means for supporting the optical switch integrally formed from a portion of the enclosure;

a reference surface integrally formed from an outside surface of the enclosure;

a fixed OFF-plane integrally formed from said supporting means, said fixed OFF-plane being a precisely controllable distance from said reference surface and generally parallel to said reference surface; and an operator, generally rectangular in shape and slidably received between the light emitter and light receiver of the optical switch, said operator being biased to a first position wherein a distal end extending outside of said enclosure is positioned at a predetermined distance from said reference surface, said operator being linearly movable to a second position, said operator further defining a window having at least one edge generally parallel to said reference surface and positioned at a precisely controllable distance from said distal end of said operator, said edge defining a movable OFF-plane such that at some predetermined linearly displacement of said distal end with respect to said reference surface, as said operator is displaced between said first and second positions, said movable Off-plane and said fixed OFF-plane coincide, thereby producing a guaranteed OFF-point.

10. The operating mechanism of claim 9 wherein said optical switch support means includes a first channel for slidably receiving the optical switch emitter and a second channel for sldably receiving the optical switch receiver, each said channel integrally formed from said enclosure and having a generally C-shaped cross-section, said channels being generally parallel and spaced apart one from the other such that an open side of said first channel faces an open side of said second channel thereby permitting a lens of the emitter to be in juxtaposed relationship with a lens of the receiver.

11. The operating mechanism of claim 10 wherein said second channel further defines first and second edges extending longitudinally along said open side and being generally parallel to said reference surface, one of said first or second edges further defining a half aperture which extends outward toward the other of said first or second edges terminating in said fixed OFF-plane, said fixed OFF-plane being generally parallel to and intermediate said first and second edges such that a small portion of the receiver lens is covered by said fixed OFF-plane.

12. A linear operating mechanism for an optical switch having a light emitter and a light receiver spaced apart one from the other, said mechanism comprising:

means for supporting the optical switch integrally formed from a portion of an enclosure housing the optical switch and its associated electronics;

a reference surface integrally formed from an outside surface of said enclosure;

a fixed OFF-plane integrally formed from said supporting means and being a precisely controllable distance from said reference surface and generally parallel to said reference surface;

an operator, generally rectangular in shape and slidably received between the emitter and receiver of the optical switch, said operator being biased to a first position wherein a distal end extending outside of said enclosure is positioned at a predetermined distance from said reference surface and is linearly movable to a second position, said operator further defining a window having at least one edge defining a movable OFF-plane, said movable OFF-plane located at a precisely controllable distance from said distal end of said operator, said movable OFF-plane and said fixed OFF-plane being coincident at some predetermined linearly displacement of said distal end with respect to said reference surface as said operator is moved between said first and second positions, thereby producing a guaranteed OFF-point.

13. The operating mechanism of claim 12 wherein said optical switch support means includes a first channel for slidably receiving the optical switch emitter and a second channel for sldably receiving the optical switch receiver, each said channel integrally formed from said enclosure and having a generally C-shaped cross-section, said channels being generally parallel and spaced apart one from the other such that an open side of said first channel faces an open side of said second channel thereby permitting a lens of the emitter to be in a juxtaposed relationship with a lens of the receiver.

14. The operating mechanism of claim 13 wherein said second channel further defines first and second edges extending longitudinally along said open side and being generally parallel to said reference surface, one of said first or second edges further defining a half aperture which extends outward toward the other of said first or second edges terminating in said fixed OFF-plane, said fixed OFF-plane being generally parallel to and intermediate said first and second edges such that a small portion of the receiver lens is covered by said fixed OFF-plane.

15. A linear operating mechanism for an optical switch, said mechanism comprising:

a portion of an enclosure defining a first and a second channel, each having a generally C-shaped cross-section and being generally parallel and spaced apart one from the other, said channels arranged such that an open side of said first channel faces an open side of said second channel, said second channel further defining a first longitudinal edge and a second longitudinal edge, said enclosure further defining a reference surface on an outside portion of said enclosure;

a slotted optical switch having an optical emitter slidably received in said first channel and an optical receiver slidably received in said second channel such that a lens of the emitter is in opposed relationship with a lens of the receiver;

a switch operator, generally rectangular in shape and made from an opaque material, said operator being slidably received between the lens of emitter and the lens of the receiver, said operator being biased to a first position wherein a distal end of said operator extends outside said enclosure a predetermined distance with respect to said reference surface, said operator being linearly movable to a second position in response to an external force applied to said distal end; said operator further defining a window at some predetermined position along its length such that when said operator is in its first position said window determines the normal state of the optical switch and when said operator is in its second position said window changes that state of the optical switch;

a half-aperture extending outward from one of said first and second longitudinal edges of said second channel, depending on the normal state of the optical switch, generally toward the other of said first and second longitudinal edges and terminating in a fixed OFF-plane, said fixed OFF-plane being generally parallel and intermediate said first and second longitudinal edges and located a precise distance from said reference of said enclosure; said half-aperture being immediately adjacent and partially covering the receiver lens;

a movable-OFF plane defined by one of a first or second side of said window depending on the normal state of the optical switch and being positioned at a predetermined distance from said distal end of said operator, said movable OFF-plane being generally parallel to said fixed-OFF plane such that as said operator is moved between its first and second positions said movable OFF-plane will at some predetermined linear displacement of said operator, with respect to said reference surface, be coincident with said fixed OFF-plane, thereby blocking light from the optical receiver.

* * * * *